United States Patent [19]
Flugstad et al.

[11] Patent Number: 4,810,977
[45] Date of Patent: Mar. 7, 1989

[54] FREQUENCY MODULATION IN PHASE-LOCKED LOOPS

[75] Inventors: Ben Flugstad, Newman Lake; Raymond L. Fried, Liberty Lake, both of Wash.; Alan Hedge, Chapel Hill, N.C.; Barton L. McJunkin, Spokane; Mark D. Talbot, Liberty Lake, both of Wash.

[73] Assignee: Hewlett-Packard Company, Palo Alto, Calif.

[21] Appl. No.: 137,843

[22] Filed: Dec. 22, 1987

[51] Int. Cl.[4] .............................................. H03C 3/09
[52] U.S. Cl. ....................... 332/19; 332/18; 332/23 R; 455/113; 455/119
[58] Field of Search ............... 332/18, 16 R, 19, 23 R, 332/30 V; 455/42, 75, 76, 113, 110, 119

[56] References Cited

U.S. PATENT DOCUMENTS 4,543,542  9/1985  Owen ........................ 332/19 X

FOREIGN PATENT DOCUMENTS 2046541  11/1980  United Kingdom ................. 332/19

Primary Examiner—Siegfried H. Grimm
Attorney, Agent, or Firm—Leslie G. Murray

[57] ABSTRACT

A phase-locked loop (PLL) frequency synthesizer having an analog, out-of-band component path and a digital, in-band component path to provide frequency modulation (FM) of the synthesized output signal is described. The in-band FM component is octave scaled by an analog scaling means and coupled to an analog-to-digital converter to provide a digital number to be decade added to the PLL divide number to change the PLL frequency in response to the in-band FM signal. The out-of-band FM component is also scaled and applied to a loop summing node and summed with the PLL error signal to vary the PLL frequency. The scaling in both the in-band component path and out-of-band component path is equalized to provide a flat frequency response. Additional, the in-band component is scaled to allow use of the analog-to-digital converter over its maximum range to maintain a high signal-to-noise ratio.

5 Claims, 2 Drawing Sheets

FREQUENCY MODULATION IN PHASE-LOCKED LOOPS

BACKGROUND OF THE INVENTION

The present invention relates generally to frequency modulation of a RF carrier signal and more particularly to frequency modulation of a synthesized RF carrier signal generated by a phase-locked loop utilizing digital techniques.

Signal generators utilizing phase-locked loop (PLL) apparatus to provide an output signal having a precise stable frequency are well known in the art. Such a PLL typically includes a tunable oscillator, such as a voltage controlled oscillator (VCO), whose output frequency is locked to the frequency of a known reference signal by means of a phase comparator. The phase comparator generates an output voltage or current that is proportional to the phase difference between the VCO output signal and the reference signal. The phase comparator output is fed back to the input of the VCO to tune the VCO to a desired frequency and eliminate any phase difference at the phase comparator. This forces the VCO output signal to have the same frequency as the reference signal. By interposing a divide-by-N block in the PLL circuit, the reference frequency may instead be compared with the VCO output frequency divided by N; the VCO output will then be locked to N times the reference frequency. Another technique, called fractional-N, makes it possible to synthesize frequencies that are any rational multiple of the reference frequency. Such a technique is disclosed in U.S. Pat. No. 3,928,813 issued to Charles A. Kingsford-Smith on Dec. 23, 1975 entitled "Device for Synthesizing Frequencies Which are Rational Multiples of a Fundamental Frequency".

In a given application, it is often desired to frequency modulate (FM) such a synthesized signal. A PLL is, in effect, a control system that maintains a constant phase difference between two signals. Any variations in the phase of one signal relative to the other signal are removed by the PLL. This property of a PLL is utilized to suppress noise and clean up the output signal; however, this property of the PLL also tends to suppress any attempts to frequency modulate the output signal.

Audio or low rate FM may be accomplished by splitting the FM signal into two separate signal paths. One path is AC coupled to the input of the VCO and is the primary path for the FM signal for frequency deviation outside the bandwidth of the PLL. For frequency deviation, inside the PLL bandwidth the FM signal is integrated and summed with the output of the phase detector or phase comparator at a loop summing node. Since phase is the integral of frequency, FM at frequencies within the PLL bandwidth is accomplished by phase modulation (PM). In order to prevent the PLL from correcting the frequency shift of the VCO output signal, a pulse has to be added or subtracted from the VCO output signal for each two pi radians of phase accumulation due to the deviation from the center frequency. Properly scaling the gains of each signal path provides flat FM response both inside and outside the PLL bandwidth. Such a technique is disclosed in U.S. Pat. No. 4,546,331 issued to DaSilva et al on Oct. 8, 1985 entitled "Frequency Modulation in a Phase-Locked Loop." The described technique is often employed to accomplish FM in PLL's; however, it has some important limitations.

There are two characteristics which inherently limit the amount of frequency deviation from the center frequency that is obtainable in a PLL. First, phase detectors or phase comparators typically operate linearly over only a range of a few degrees or a small fraction of a radian. This forces the maximum obtainable frequency deviation to be small at low modulation rates. Secondly, an integrator generally comprises an operational amplifier with a capacitor in its feedback path. Practical integrators cannot provide an output that is higher than the power supply voltage, typically plus or minus 10 to plus or minus 15 volts. This determines the maximum PM signal, further restricting the maximum FM deviation obtainable.

A typical application requires a RF signal to be frequency modulated at audio rates and at high carrier frequency deviations. This application requires a large modulation index, where the modulation index is the ratio of the maximum frequency shift in the VCO output to the modulation rate. Usually a large modulation index is obtained by constructing a PLL having a narrow bandwidth thus allowing most of the FM to be accomplished outside the loop bandwidth. The limitation of a narrow bandwidth loop is that the stability provided by a wide bandwidth PLL is lost. Further, narrow bandwidth loops are inherently noisier and more susceptible to spurs and jitter caused by external sources, such as vibration than are wide bandwidth loops.

SUMMARY OF THE INVENTION

In accordance with principles of the present invention, a phase-locked loop (PLL) having both digital and analog FM signal input paths to frequency modulate the PLL output signal at modulation rates both within the PLL bandwidth as well as outside of the PLL bandwidth is provided. The PLL includes a voltage controlled oscillator (VCO), fractional-N means for periodically changing the rational number by which the VCO output signal is frequency divided, a phase detector for comparing the phase of the frequency divided output signal with the phase of a predetermined reference signal and for producing an error signal representing the detected phase difference and a loop filter for suitably processing the phase detector signal to produce an error signal for controllably adjusting the VCO frequency. The high rate, out-of-band FM signal is analog coupled to the control input of the VCO via delay compensation and filter circuits to provide out-of-band frequency modulation of the VCO output signal. The low rate, in-band FM is coupled to an analog to digital convertor (ADC) to provide a digital signal to be digitally added to the digital signal controlling the VCO center frequency to real time modulate the VCO output signal by changing the PLL divide number.

Utilizing a digital phase detector which is linear over a wide range allows the in-band frequency modulation to be achieved by directly changing the loop divide number. The maximum obtainable frequency deviation is no longer limited by the phase detector, but is limited only by the slewing capability of the phase-locked loop and provides an infinite modulation index. Further, the maximum frequency deviation is no longer limited by the power supply voltage, thus providing large frequency deviation at high rates. The in-band FM bandwidth is limited only by the sampling rate of the ADC and the data input rate to the fractional-N circuitry. Equalizing the time delay through the FM analog and FM digital paths insures maximum FM frequency response flatness. Signal distortion and frequency response is further improved by use of a high resolution PLL provided by fractional-N techniques. Since the modulation index is not dependent upon the PLL bandwidth, the stability and noise characteristics provided by a wide bandwidth PLL may be taken advantage of. Further, implementing a digital in-band FM loop provides a less complex circuit requiring fewer components than the prior art techniques to achieve in-band low rate FM and DCFM.

DETAILED DESCRIPTION OF THE PREFERRED EMBODIMENT

Figure 1:
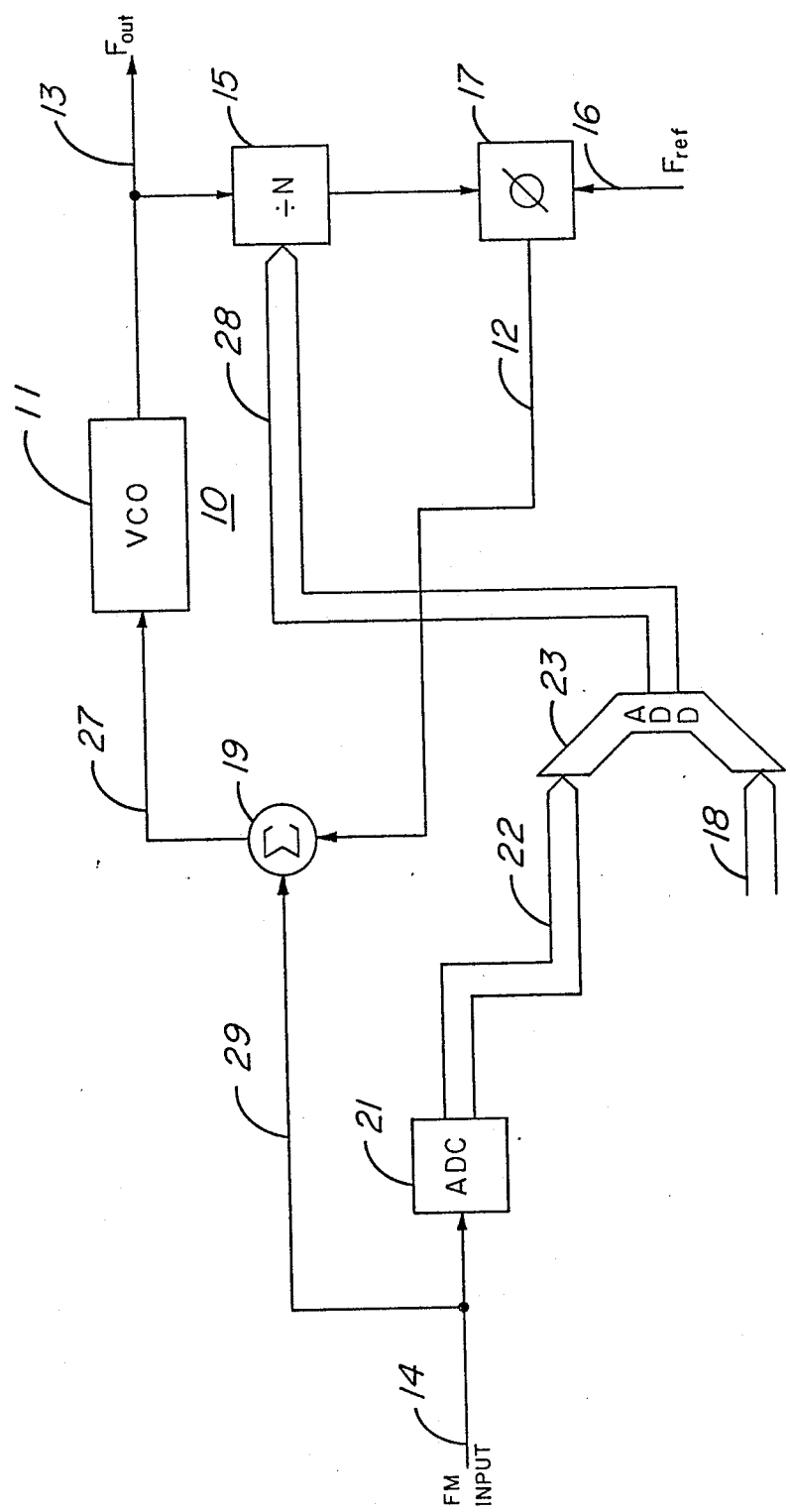
FIG. 1 is a conceptual block diagram of a phase-locked loop implementing digital low rate frequency modulation in accordance with the principles of the present invention.
Figure 2:
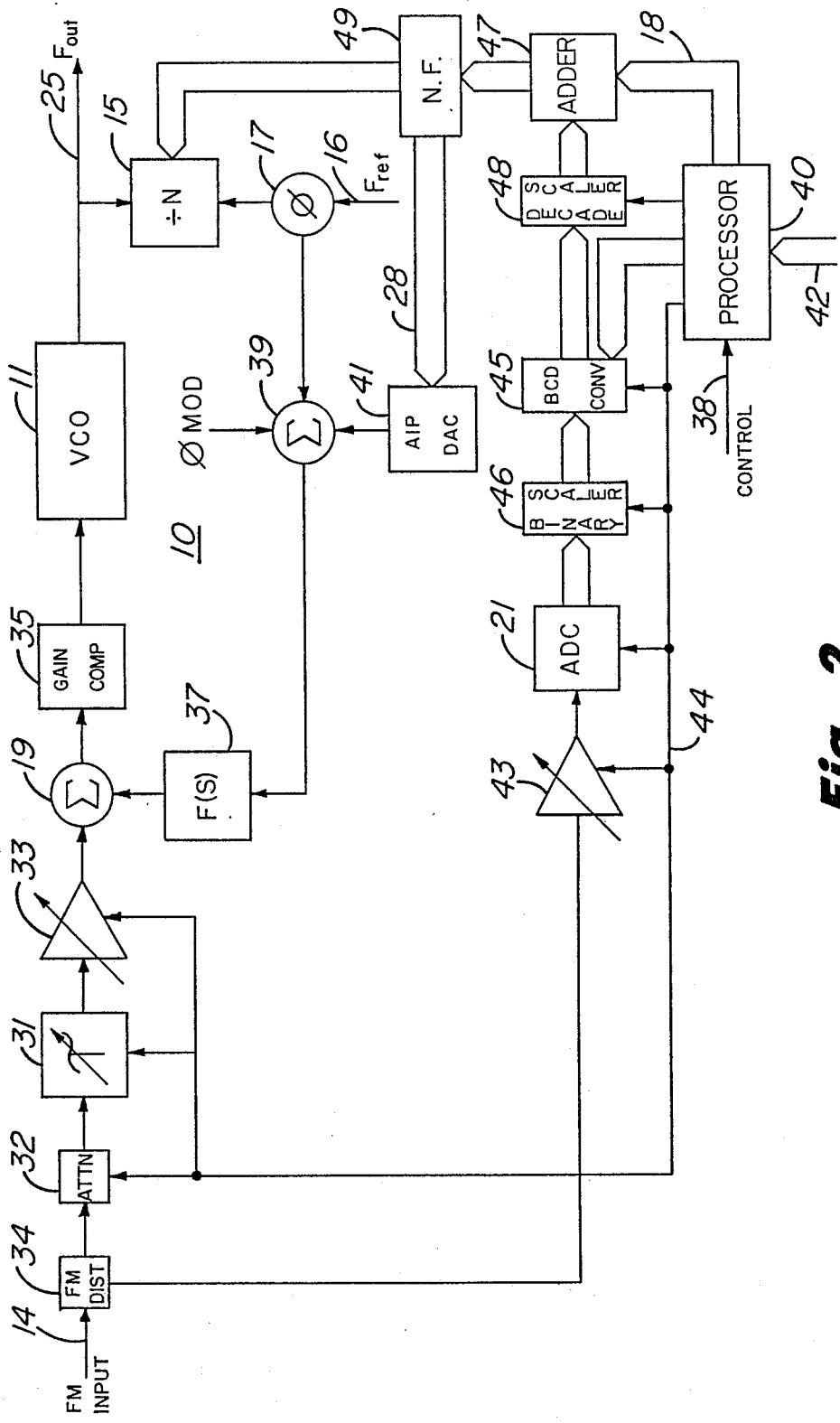
FIG. 2 is a detailed functional block diagram of the phase-locked loop shown in FIG. 1.

Referring now to the drawings, and particularly to FIG. 1, a phase-locked loop (PLL) frequency synthesizer implementing both analog and digital techniques to provide a frequency modulated output signal is shown. The PLL 10 comprises a voltage controlled oscillator (VCO) 11 for providing an output signal $F_{out}$ on line 13 in response to a control signal applied to the VCO 11 on line 27. The frequency of the output signal $F_{out}$ is selectively variable over a full decade from approximately 520 mHz to 1040 mHz. The VCO 11 is a negative resistance oscillator and includes a delay line discriminator (not shown) which measures FM noise on the oscillator output signal and provides feedback to the VCO 11 input circuits (not shown) to minimize the VCO 11 phase noise. VCO 11 is described in more detail in the co-pending application entitled "Fast Frequency Settling Signal Generator Utilizing a Frequency-Locked Loop", Ser. No. 07/118,118 filed on Nov. 6, 1987 and assigned to the instant assignee and is hereby incorporated by reference. The output signal of the VCO 11 is frequency divided by fractional-N divide means 15 to provide an input signal to the digital phase detector 17 having a frequency equal to the VCO 11 output frequency divided by a selectable rational number. Digital phase detector 17 compares the phase of a predetermined reference signal, $F_{ref}$ on line 16, with the phase of the frequency divided VCO output signal and provides an error signal having a value which is proportional to the phase difference between the two input signals. The error signal is filtered in the loop filter 37 and then coupled to the loop gain compensation circuitry 35 (as shown in FIG. 2). Since the gain of the PLL loop components, particularly the VCO 11, is frequency sensitive, the loop gain compensation circuitry 35 provides a control signal to the VCO 11 having a constant predetermined sensitivity over the full VCO 11 frequency range.

The desired FM input signal on line 14 is coupled to the PLL 10 via two separate signal paths. The FM input signal on line 14 may be internally generated in response to commands input at the front panel (not shown) of the instrument or it may be an externally generated modulation signal input via an external FM port. The analog FM signal coupled on line 29 to summer 19 is summed with the phase detector 17 error signal on line 12 and provides FM modulation of the VCO 11 output signal at FM rates and frequency deviations outside the PLL 10 bandwidth. For FM modulation at low rates and frequency deviation within the PLL 10 bandwidth, the FM input signal is coupled to analog-to-digital converter (ADC) 21 for conversion to a 12-bit digital data signal. The FM signal input to ADC 21 is scaled to permit the use of the full range of ADC 21. If the ADC 21 is not utilized over its full range, accuracy and resolution is lost. The ADC 21 also utilizes an offset reference input voltage to insure that 0 volts from a bipolar input to ADC 21 provides a midrange output to minimize frequency offset from the desired VCO 11 center frequency. The digital FM signal on bus 22 is coupled to decade adder 23 to be added to the digital signal on bus 18 representing the desired center frequency of VCO 11. Utilizing a decade adder to perform this addition allows ADC 21 to be used over its full range and provides a wide dynamic range for maximum FM deviation. The digital output of adder 23 on bus 28 is coupled to the fractional-N divide means 15 to vary the fractional-N divide number and thereby modulate the PLL 10 frequency.

Referring now also to FIG. 2, the desired characteristics for the PLL output signal, $F_{out}$, including VCO 11 center frequency, FM deviation and FM rate are programmed at the instrument front panel (not shown) and input in digital form to the host processor 40 on bus 42. The analog FM input on line 14 is generated internally by the instrument under the direction of the processor 40. An external FM input port (not shown) may be also be used, so long as the external FM signal has the proper characteristics. The PLL 10 has four different FM sensitivities: 3.33 kHz/volt, 33.3 kHz/volt, 333 khz/volt and 3.33 mHz/volt. These FM sensitivities are set by attenuating the analog FM signal prior to coupling it to the VCO 11 tune line. Attenuator circuit 32 provides four selectable levels of attenuation: 0, 20, 40 and 60 dB. The host processor 40 sets the attenuation level according to the programed FM deviation. When the attenuator 32 is set, the processor 40 will switch in the attenuation elements physically closest to the VCO 11 first to minimize signal noise. The FM delay compensation circuitry 31 compensates for a time delay of approximately 34 microseconds introduced in the digital in-band FM path. The FM delay compensation circuitry 31 effectively delays the out-of-band FM signal by the same amount of time as the digital FM signal. Equalizing the time delay through the analog path and the digital path provides a flat frequency response over the entire range of the PLL.

Variable amplifier 33 comprises a discrete operational amplifier utilizing FET switches to selectively change the gain of the amplifier from two to five. Variable amplifier 33 also includes FM shaping circuits to compensate for signal compression affects whenever the FM signal is programed to provide greater than a 1 mHz FM deviation in the VCO frequency band. The FM shaper circuit comprises a dual PNP/NPN current buffer whose bias circuit is designed to limit the output signal. For programed FM deviations of 1 mHz and less the gain of the variable amplifier 33 is set at two. For FM deviations greater than 1 mHz, the gain is switched to five. The gain of five offsets signal losses due to the FM shaper circuits which are in the FM signal path only when the FM deviation is programed to be greater than 1 mHz deviation.

The in-band FM signal is coupled from the FM distribution circuit 34 to the analog scaling amplifier 43. The FM distribution circuit 34 includes an FM analog amplifier (not shown) which amplifies the in-band FM signal coupled to the scaling amplifier 43 such that a 5 volt signal is always coupled to the scaling amplifier 43 input. The analog scaling amplifier 43 provides proper polarity selection and pre-scaling of the FM signal for the programmed frequency deviation to allow the ADC 21 to operate over its full range. The scaling amplifier 43 has an adjustable gain of 0.5 to 1.0 which provides scaling over each octave of programmed frequency deviation and provides a bipolar output around a 0 volt reference which varies from ±2.5 volts to ±5 volts as a function of the programmed deviation from the center VCO frequency; e.g., a programmed frequency deviation of −500 kHz would require a −2.5 volt output from the scaling amplifier 43.

The scaled FM analog signal is then coupled to the ADC 21 for conversion to a 12-bit digital data signal. A 12-bit ADC provides $2^{12}$ or 4096 output steps or values. ADC 21 is referenced to a non-zero offset voltage such that it will respond to the bipolar analog input provided by the scaling amplifier 43. One-half (2048) of the digital steps are assigned to the negative portion (frequency decrease) of the analog input signal and the other half (2048) of the digital steps are assigned to the positive portion (frequency increase) of the analog input signal. The ADC 21 input sensitivity is adjusted for each octave of programmed frequency deviation; e.g., if the programmed deviation range is ±2 kHz, the programmed ADC input sensitivity will be 0.98 Hz per step in the frequency range of 501–1000 Hz and in the frequency range of 1001–2000 Hz the programmed sensitivity will be 1.95 Hz per step. The programmable input sensitivity ensures that the ADC 21 will always be utilized over at least one-half of its full scale range regardless of programmed deviation and maximizes the signal to noise ratio. The processor 40 provides timing and control signals to the ADC 21 and other circuit components on line 44 for the digital conversion. The ADC 21 is a successive approximation ADC which utilizes a digital-to-analog convertor (DAC) to create an analog signal which is compared with the FM analog input signal. After a binary search covering each of the 12 bits is concluded, the digitized FM signal is clocked into the digital binary scaler 46.

Since the sensitivity of the ADC 21 changes from octave to octave of the programmed FM deviation, the ADC output signal is related to the desired frequency deviation by a binary number and has to be scaled so that the loop divide number will be changed by the proper amount. Binary scaler 46 scales (multiples by 1, ½, ¼, or 1/5) the ADC output signal to provide a binary representation of the programmed frequency deviation. The digital scaled binary signal is then coupled to the binary coded decimal (BCD) conversion block 45. The digital BCD conversion block performs a binary to BCD conversion under the control of the processor 40 to provide a BCD number which represents the magnitude of increase or decrease for each decade of the fractional-N divisor number to achieve the desired frequency deviation. For example, for a programmed deviation of 5 Hz, the BCD number will be equivalent to 5 and be added to the $10^0$ column; for a programmed deviation of 50 Hz, the BCD number will also be equivalent to 5, but will be added to the $10^1$ column. Decade scaler 48 scales the BCD conversion block 45 output so that the BCD number is added to the proper decade of the fractional-N divisor number. Adder 47 performs digital addition of the scaled BCD signal and a BCD signal on bus 18 representing the programmed VCO center frequency input on bus 42 to the processor 40. The resulting BCD data is then coupled to the fractional-N block 49 to modulate the loop frequency. In the preferred embodiment, the binary scaler 46 and BCD conversion block 45 are implemented together as a ROM look up table. The ADC 21 output comprises a row address and the binary scaling factor input by the processor 40 comprises a column address to select the correct BCD number output from the ROM. The decade scaler 48 and adder 47 comprise a serial adder wherein the BCD input is clocked into the decade scaler 48 register at the proper time to be added to the correct decade of the fractional-N divisor number to achieve the programmed frequency deviation.

The analog scaler 43, and the binary scaler 46 are controlled by the processor 40 to maximize the output of the ADC 21 over the deviation range of the instrument to maximize the signal-to-noise ratio. In addition, the analog scaler 43, the binary scaler 46 and the decade scaler 48 are cooperatively controlled by the processor 40 to maintain the overall gain of the in-band FM (digital) signal path equal to the overall gain of the out-of-band FM (analog) signal path to provide a constant FM sensitivity over the entire deviation range and frequency range of the instrument.

The fractional-N block 49 controls both the integer divisor and the fractional-N divisor for the divide-by-N block 15 and also provides a BCD signal representing the programmed PLL center frequency to the analog phase interpretation (API) DAC 41. The API DAC 41 provides an analog signal to loop summer 39 to bias the VCO 11 tune line for the programmed center frequency. A phase modulation signal may also be directly summed into the PLL loop at the summer 39.

We claim:

1. A phase-locked loop frequency synthesizer for providing a frequency modulated output signal having a controllably selectable frequency, comprising:

voltage controlled oscillator means for generating an output signal having a frequency that is controllably variable over a predetermined frequency range;

frequency divider means coupled to the output of said voltage controlled oscillator means for providing a first signal having a frequency equal to the frequency of said output signal divided by a predetermined divisor N;

phase detector means for comparing the phase of said first signal to the phase of a predetermined reference signal and providing an error signal representative of a phase difference between said first signal and said reference signal, said error signal coupled to a control input of said voltage controlled oscillator means to control the frequency of said output signal;

input means for coupling a frequency modulation signal to said phase-locked loop, said input means having at least two outputs;

loop summing means interposed in said phase-locked loop between said phase detector means and said voltage controlled oscillator means and coupled to a first output of said input means, said loop summing means for summing an out-of-band component of said frequency modulation signal with said error signal;

first analog scaling means interposed between said first output of said input means and said loop summing means for scaling said out-of-band component of said frequency modulation signal;

second analog scaling means coupled to a second output of said input means for scaling an in-band component of said frequency modulation signal;

analog-to-digital converter means coupled to said second analog scaling means for providing a first digital signal representative of said in-band component of said scaled frequency modulation signal;

digital scaling means coupled to an output of said analog-to-digital converter means for scaling said first digital signal to provide a second digital signal indicative of a desired frequency deviation represented by said frequency modulation signal; and digital adder means coupled to said digital scaling means for adding said second digital signal to a third digital signal, said third digital signal representative of a predetermined phase-locked loop center frequency, said digital adder means providing a fourth digital signal to said frequency divider means to modify the frequency divisor N in response to said in-band frequency modulation signal thereby modulating said frequency-locked loop frequency.

2. A phase-locked loop frequency synthesizer as in claim 1 further comprising control means responsive to a programmed frequency deviation value to cooperatively adjust said second analog scaling means and said digital scaling means and to adjust said first analog scaling means such that the gain factor for said out-of-band component is equal to the gain factor of said in-band component at every programmed frequency deviation.

3. A phase-locked loop frequency synthesizer as in claim 2 wherein said digital scaling means includes binary scaling means and binary to binary coded decimal conversion means for scaling said second digital signal and for providing said scaled second digital signal in a binary coded decimal format and said third digital signal comprising a digital signal in binary coded decimal format.

4. A phase-locked loop frequency synthesizer as in claim 3 wherein said second analog scaling means and said binary scaling means scale said in-band component of said frequency modulation signal such that said analog-to-digital conversion means operates over a predetermined output range for each desired frequency deviation represented by said frequency modulation signal.

5. A phase-locked loop frequency synthesizer as in claim 4 wherein said digital scaling means further includes decade scaling means interposed between said binary coded decimal conversion means and said digital adder means for decade scaling said second digital signal.

* * * * *